United States Patent [19]

Saito et al.

[11] Patent Number: 5,416,920

[45] Date of Patent: May 16, 1995

[54] METHOD OF AUTOMATICALLY TESTING AN EXTENDED BUFFER MEMORY

[75] Inventors: Koji Saito; Kenji Matabe, both of Tokyo, Japan

[73] Assignee: NEC Corporations, Tokyo, Japan

[21] Appl. No.: 896,438

[22] Filed: Jun. 10, 1992

[30] Foreign Application Priority Data

Jun. 10, 1991 [JP] Japan .................................. 3-164960

[51] Int. Cl.⁶ ........................ G06F 11/00; G11C 29/00
[52] U.S. Cl. .................................. 395/575; 371/21.1; 371/15.1
[58] Field of Search ............. 395/575; 364/240, 240.2, 364/240.5, 746.6; 371/21.2, 15.1, 16.1, 21.1

[56] References Cited

U.S. PATENT DOCUMENTS

| | | | |
|---|---|---|---|
| 4,313,161 | 1/1982 | Hardin et al. | 364/200 |
| 4,393,459 | 7/1983 | Huntley et al. | 364/900 |
| 5,115,499 | 5/1992 | Stiffler et al. | 395/425 |
| 5,146,607 | 9/1992 | Sood et al. | 395/800 |

*Primary Examiner*—Robert W. Beausouel, Jr.
*Assistant Examiner*—Norman M. Wright
*Attorney, Agent, or Firm*—Foley & Lardner

[57] ABSTRACT

In an extended buffer memory shared among a plurality of processors and operable to carry out a data transfer operation to and from one of the plurality of processors which is logically connected to the extended buffer memory, each of a plurality of connection information indicating means indicates whether or not each of the plurality of processors is logically connected to the extended buffer memory. Test information indicating means indicates, by test information having a predetermined logic value, that one of the processors is capable of carrying out a test. The test information having the predetermined logic value is capable of setting the test information indicating means when all of the plurality of connection information indicating means indicates that all of the plurality of processors are logically disconnected from the extended buffer memory. One of the data processors can automatically carry out the test for the extended buffer memory when the test information indicating means has the test information having the predetermined logic value.

3 Claims, 7 Drawing Sheets

METHOD OF AUTOMATICALLY TESTING AN EXTENDED BUFFER MEMORY

BACKGROUND OF THE INVENTION

This invention relates to an extended buffer memory shared among a plurality of data processors and method of testing the extended buffer memory in accordance with a predetermined test program.

An extended buffer memory shared among a plurality of data processors is generally called a shared extended buffer memory and is operable to carry out a data transfer operation to and from one of the processors which is logically connected to the shared extended buffer memory. Each of the data processors comprises a central processing unit, a main memory unit, and a memory control unit. When one of the data processors requires the use of the shared extended buffer memory, the one of the data processors supplies a connection request to the shared extended buffer memory. If the shared extended buffer memory is vacant, the connection request is accepted. This means that the one of the data processors is logically connected to the shared extended buffer memory. When the one of the data processors is logically connected to the shared extended buffer memory, the other data processors have limited access to the shared extended buffer memory.

In the meanwhile, a test of the shared extended buffer memory should be periodically carried out to detect whether or not the shared extended buffer memory has a trouble or an obstacle. Any data processor can test the shared extended buffer memory in accordance with a predetermined test program. The test program is memorized in the main memory unit of each of the data processors. In practice, an operator gives a test execution instruction to one of the data processors through an instruction input device, such as a keyboard, to carry out the test of the shared extended buffer memory. In this event, the operator has to check whether or not the shared extended buffer memory is occupied. In other words, the operator has to check whether or not one of the data processors is logically connected to the shared extended buffer memory. If the one of the data processors occupies the shared extended buffer memory, the operator must wait for an input operation of the test execution instruction. At any rate, in a conventional shared extended buffer memory testing method, it is impossible to carry out the test of the shared extended buffer memory without a judgement of the operator.

SUMMARY OF THE INVENTION

It is therefore an object of this invention to provide a method capable of automatically carrying out a test of a shared extended buffer memory.

It is another object of this invention to provide the shared extended buffer memory particularly useful in the method mentioned above.

Other object of this invention will become clear as the description proceeds.

On describing the gist of a first aspect of this invention, it is possible to understand that an extended buffer memory is shared among a plurality of processors and is operable to carry out a data transfer operation to and from one of the plurality of processors which is logically connected to the extended buffer memory. Each of the plurality of processors supplies a set request to the extended buffer memory when each of the plurality of processors carries out a test for the extended buffer memory in accordance with a predetermined test program.

According to the first aspect of this invention, the extended buffer memory comprises a plurality of connection information indicating means each of which corresponds to each of the plurality of processors for indicating whether or not the each of the plurality of processors is logically connected to the extended buffer memory, test information indicating means for indicating whether or not the one of the plurality of processors is capable of carrying out the test, and authorizing means connected to the plurality of connection information indicating means and supplied with the set request for authorizing the test information indicating means to indicate that the one of the plurality of processors is capable of carrying out the test when all of the connection information indicating means indicate that all of the plurality of processors are logically disconnected from the extended buffer memory.

On describing the gist of a second aspect of this invention, it is possible to understand that a method is provided for testing an extended buffer memory shared among a plurality of processors and operable to carry out a data transfer operation to and from one of the plurality of processors which is logically connected to the extended buffer memory. Each of the plurality of processors supplies a set request to the extended buffer memory when each of the plurality of processors carries out a test for the extended buffer memory in accordance with a predetermined test program. The extended buffer memory comprises test information indicating means for indicating, by test information, whether or not the one of the plurality of processors is capable of carrying out the test. The test information represents that the one of the plurality of processors is capable of carrying out the test when the test information has a predetermined logic value.

According to the second aspect of this invention, the method comprises the steps of executing a set instruction to make the test information indicating means have the test information of the predetermined logic value, deciding whether or not the test information indicating means have the test information of the predetermined logic value, logically connecting the one of the plurality of processors to the extended buffer memory when the test-information indicating means have the test information of the predetermined logic value, authorizing execution of the test when the test information indicating means has the test information of the predetermined logic value, and rejecting execution of the test when the test information indicating means has no test information of the predetermined logic value.

DESCRIPTION OF THE PREFERRED EMBODIMENTS

Figure 1:
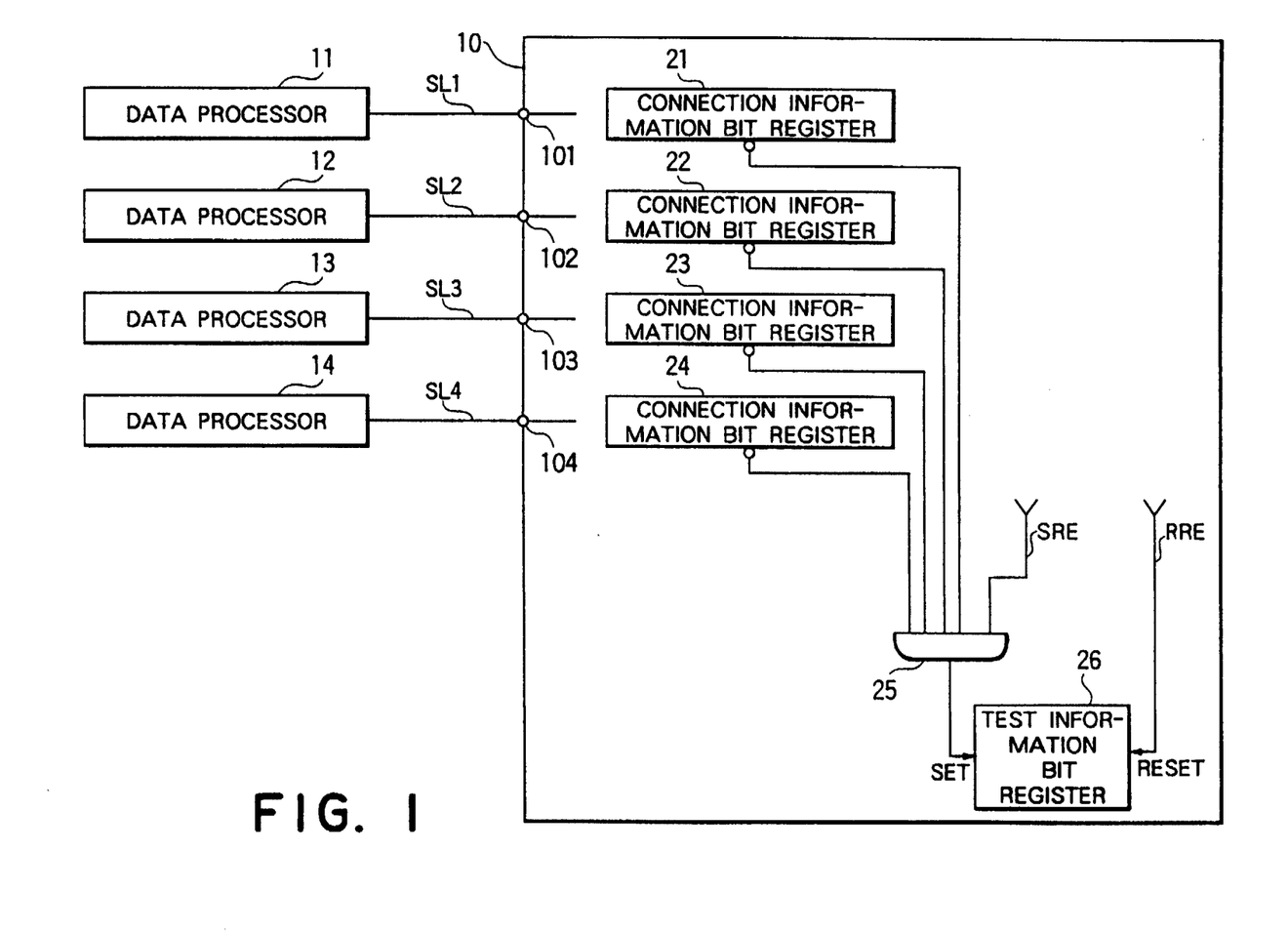
FIG. 1 is a block diagram for illustrating a shared extended buffer memory according to a preferred embodiment of this invention and illustrating a connection relation between the shared extended buffer memory and a plurality of data processors.

Referring to FIG. 1, description will be made as regards a shared extended buffer memory 10 according to a preferred embodiment of this invention. The shared extended buffer memory 10 comprises first through fourth ports 101 to 104 which are connected to first through fourth data processors 11 to 14 through first through fourth signal lines SL1, SL2, SL3, and SL4, respectively. This means that the first through the fourth data processors 11 to 14 are physically connected to the shared extended buffer memory 10. The first through the fourth data processors 11 to 14 share the shared extended buffer memory 10. For example, when the first data processor 11 requires the use of the shared extended buffer memory 10, the first data processor 11 delivers a connection request to the shared extended buffer memory 10. If the shared extended buffer memory 10 is vacant, the connection request is accepted. The shared extended buffer memory 10 is operable to carry out a data transfer operation to and from the first data processor 11. This means that the first data processor 11 is logically connected to the shared extended buffer memory 10. This applies to the second through the third data processors 12 to 14. The second through the third data processors 12 to 14 are rejected to utilize the shared extended buffer memory 10 while the first data processor 11 occupies the shared extended buffer memory 10.

The shared extended buffer memory 10 comprises first through fourth connection information bit registers 21 to 24 each of which corresponds to each of the first through the fourth data processors 11 to 14. Each of the first through the fourth connection information bit registers 21 to 24 is a single bit register and is provided for registering first through fourth connection flags or information each of which indicates whether or not each of the first through the fourth data processors 11 to 14 is logically connected to the shared extended buffer memory 10. Therefore, each of the first through the fourth connection information consists of a single bit. For example, when the first data processor 11 is logically connected to the shared extended buffer memory 10, the first connection information has a logic one value. If the first data processor 11 is logically disconnected from the shared extended buffer memory 10, the first connection information has a logic zero value. The first through the fourth connection information bit registers 21 to 24 have first through fourth inverting output terminals, respectively, depicted at small circles and produce first through fourth inverted connection information through the first through the fourth inverting output terminals, respectively. Under the circumstances, each of the first through the fourth connection information bit registers 21 to 24 may be called connection information indicating means.

The shared extended buffer memory 10 further comprises an AND gate 25 having first through fourth input terminals connected to the first through the fourth inverting output terminals, respectively, and having a fifth input terminal supplied with a set request SRE. The set request SRE consists of a single bit and is supplied from one of the first through the fourth data processors 11 to 14. For example, when the first data processor 11 requires a test for the shared extended buffer memory 10, the first data processor 11 delivers the set request SRE to the AND gate 25. The AND gate 25 delivers a gate output signal having a logic one value in the case that the AND gate 25 is supplied with the set request SRE having the logic one value and that all of the first through the fourth inverted connection information have the logic one value. This means that none of the first through the fourth data processors 11 to 14 is logically connected to the shared extended buffer memory 10. In other words, none of the first through the fourth data processors 11 to 14 occupies the shared extended buffer memory 10.

The shared extended buffer memory 10 further comprises a test information bit register 26 connected to the AND gate 25. The test information bit register 26 is for registering test information indicative of whether or not the one of the first through the fourth data processors 11 to 14 is capable of carrying out the test. The test information bit register 26 registers the test information having the logic one value, when the AND gate 25 produces the gate output signal having the logic one value. Accordingly, when the test information bit register 26 has the test information of the logic one value, it means that one of the first through the fourth data processors 11 to 14 is capable of carrying out the test. On the contrary, when the test information bit register 26 has the test information of the logic zero value, it means that none of the first through the fourth data processors 11 to 14 is capable of carrying out the test. Under the circumstances, the AND gate 25 may be called authorizing means for authorizing the test information bit register 26 to have the test information of the logic one value. The test information bit register 26 may be called test information indicating means. Each of the first through the fourth data processors 11 to 14 is capable of referring to the test information. Furthermore, all the first through the fourth data processors 11 to 14 are capable of resetting the test information bit register 26 by a reset request RRE on completion of the test. As a result of the reset, the test information is changed or updated from the logic one value to the logic zero value. Above described operation is carried out in dependent upon a test information set instruction and a reset instruction which will later be described.

Figure 2:
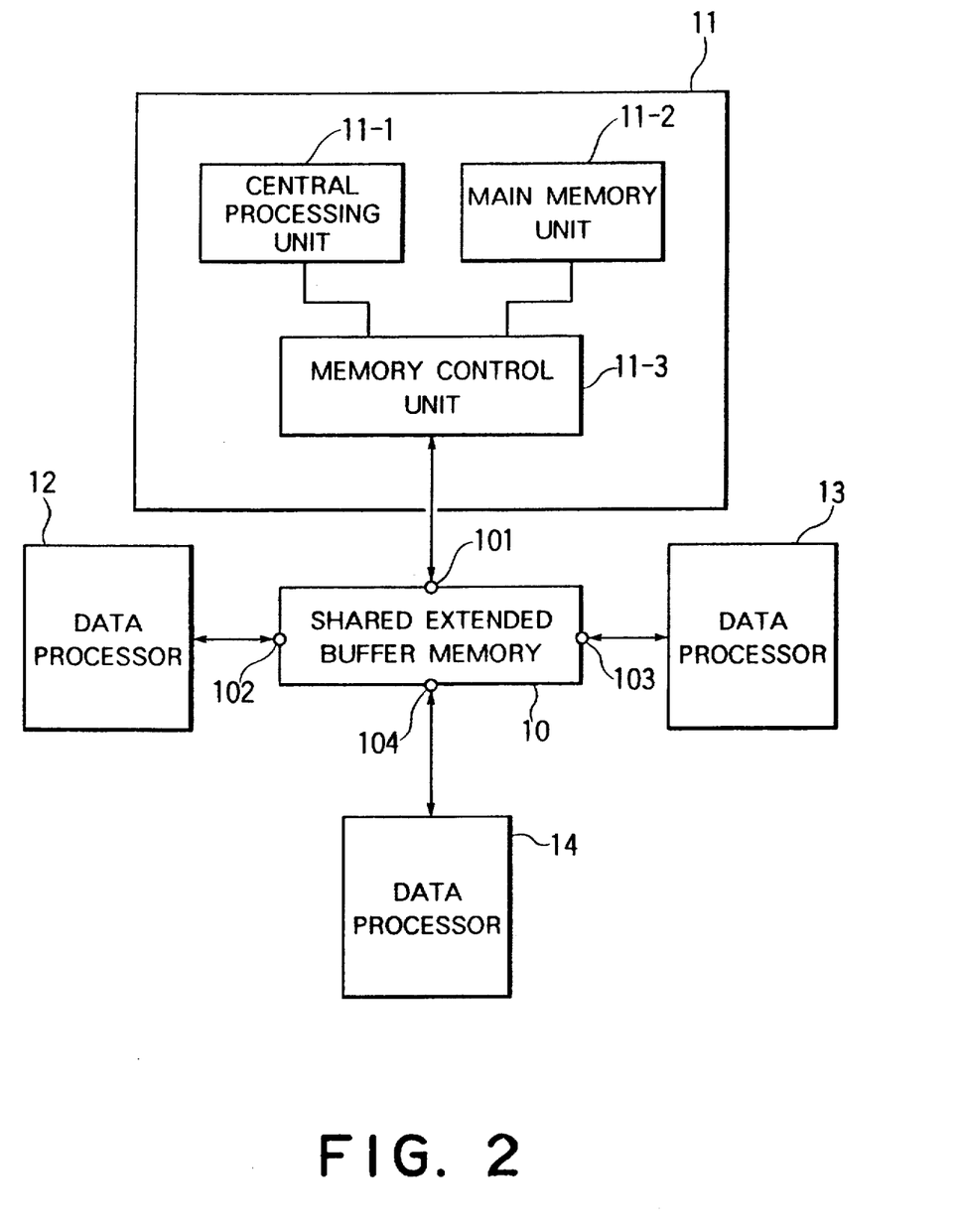
FIG. 2 is a block diagram for illustrating the construction of one of the data processors illustrated in FIG. 1.

Referring to FIG. 2, the description will proceed to the first data processor 11. As is well known in the art, the first data processor 11 comprises a first central processing unit 11-1, a first main memory unit 11-2, and a first memory control unit 11-3. Each of the second through the fourth data processors 12 to 14 has the same construction as the first data processor 11.

Figure 3:
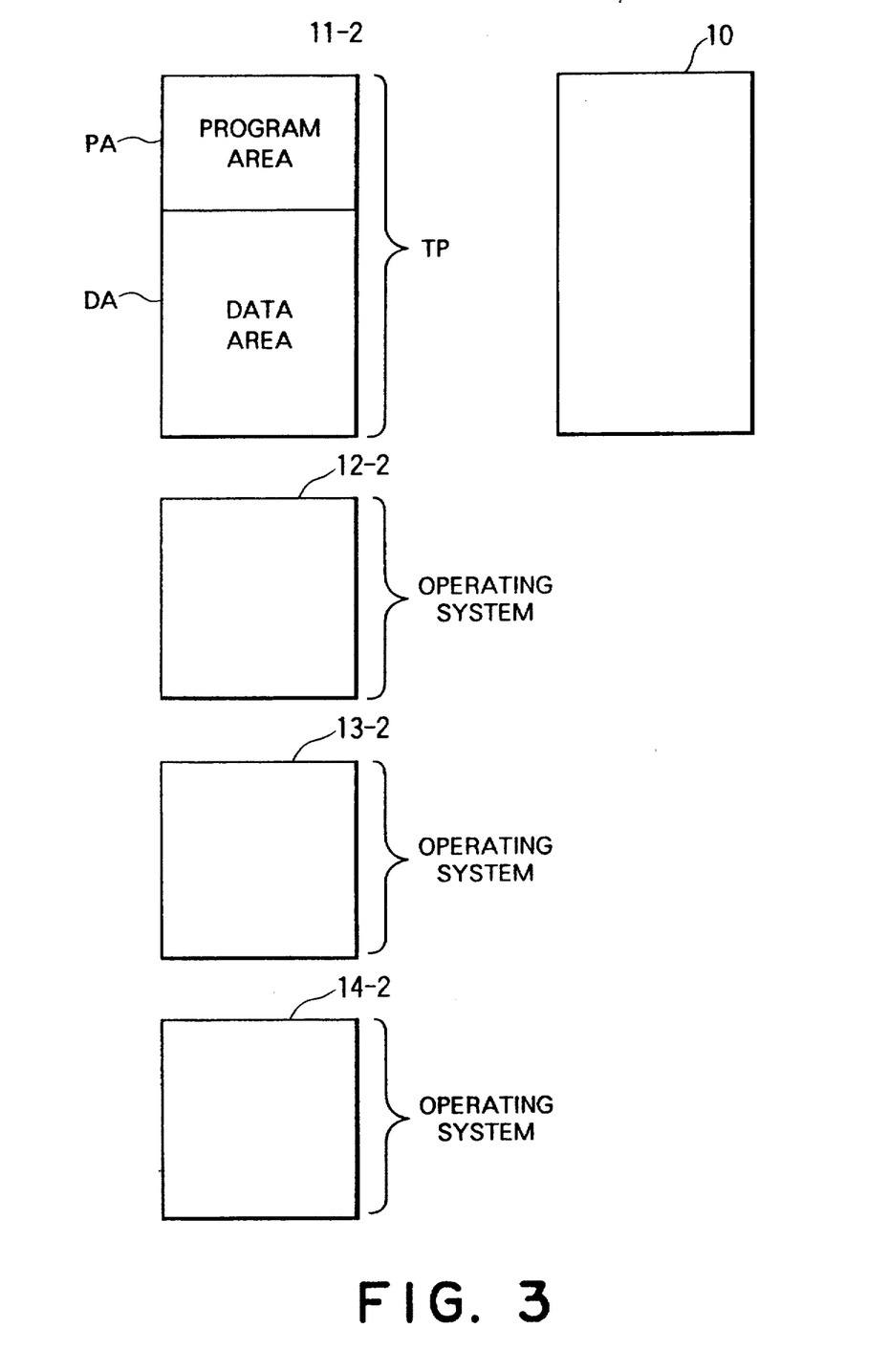
FIG. 3 is an illustration for use in describing operations of main memory units included in the data processors illustrated in FIG. 1.

Referring to FIG. 3, the description will be made as regards relation between the shared extended buffer memory 10 and the first through fourth main memory units 11-2, 12-2, 13-2, and 14-2. The second through the fourth main memory units 12-2, 13-2, and 14-2 are included in the second through the fourth data processors 12 to 14, respectively. In the example being illustrated, the first data processor 11 is going to carry out the test for the shared extended buffer memory 10 in accordance with a predetermined test program TP stored in the first main memory unit 11-2. The first main memory unit 11-2 comprises a program area PA and a data area DA both of which are for use in carrying out the predetermined test program TP. The predetermined test program TP will be described later. Each of the second through the fourth data processors 12 to 14 carries out each operating system by using the second through the fourth main memory units 12-2 to 14-2. Generally speaking, a single data processor occupies a single operating system as will presently be described. However, a single data processor can utilize a plurality of operating systems in a virtual computing system.

Figure 4:
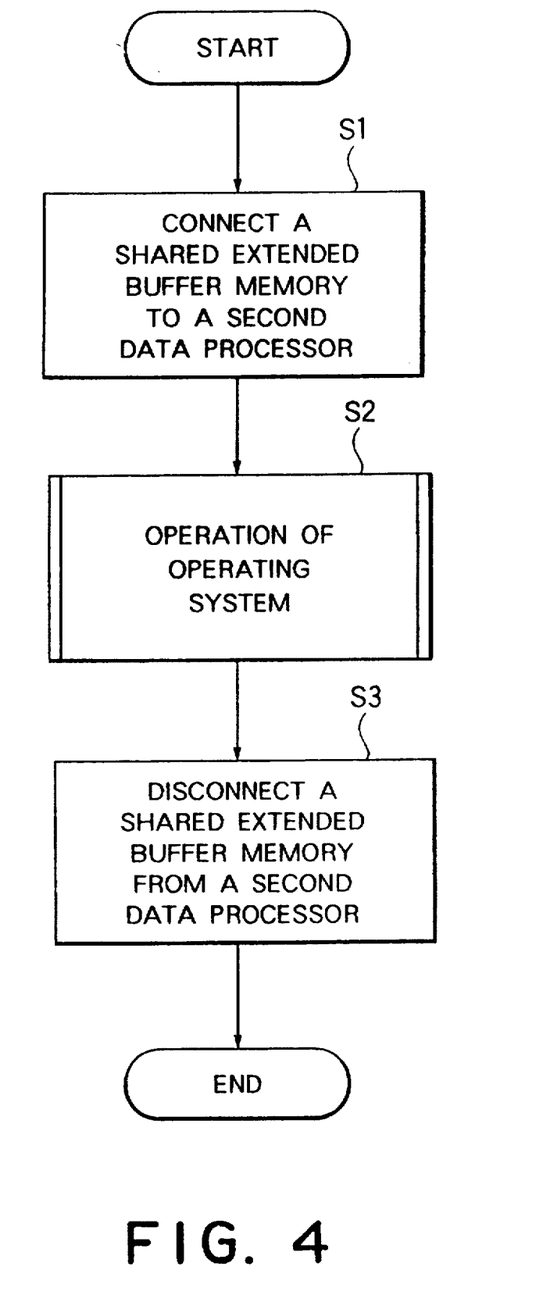
FIG. 4 shows a flow chart for use in describing operations of the data processors illustrated in FIG. 1.

Referring to FIG. 4, the description will be made as regards the second data processor 12 which carries out the operating system by using the shared extended buffer memory 10. At a first step S1, the second data processor 12 produces the connection request. If the shared extended buffer memory 10 is vacant, the connection request is accepted. As a result, the shared extended buffer memory 10 is logically connected to the second data processor 12. In this event, the second connection information of the second connection information bit register 22 is set into the logic one value.

At a second step S2, the second data processor 12 carries out the operating system by using the shared extended buffer memory 10. When the second data processor 12 completes the operation of the operating system, the operation proceeds to a third step S3. At the third step S3, the shared extended buffer memory 10 is logically disconnected from the second data processor 12.

Figure 5:
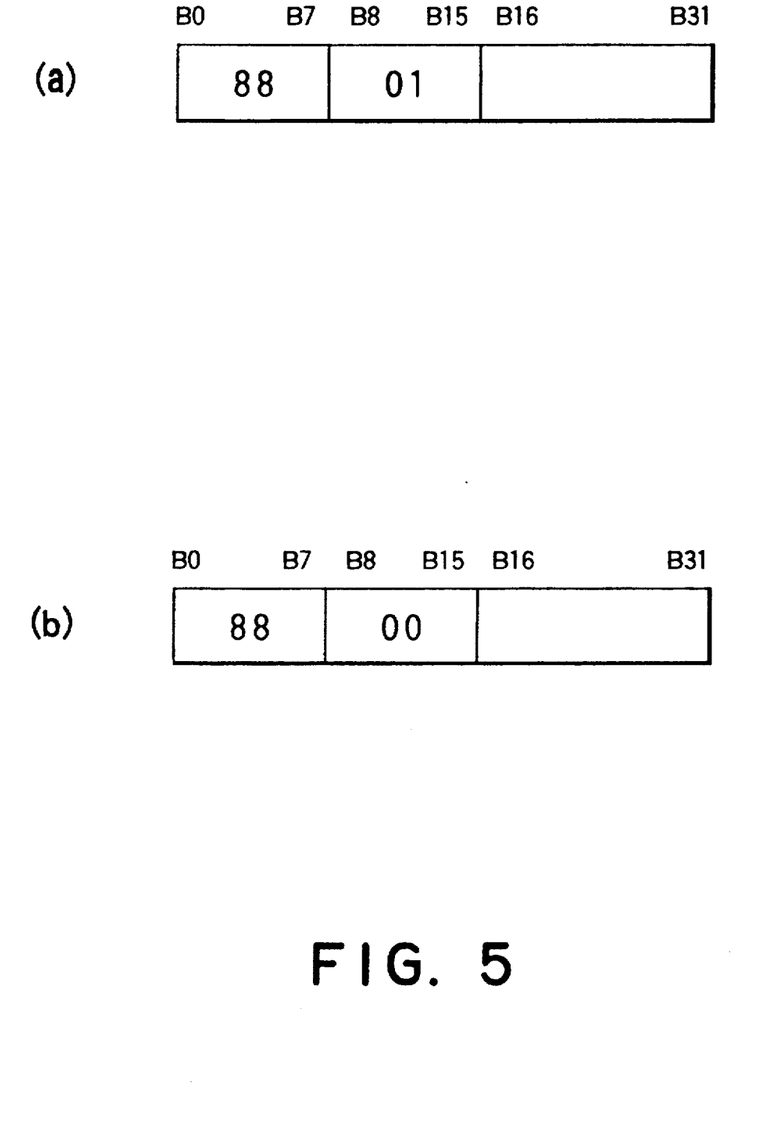
FIGS. 5(a) and 5(b) shows formats of test information set and reset instructions carried out by the data processors illustrated in FIG. 1.

Referring to FIG. 5, the description will proceed to formats of the test information set instruction and the reset instruction mentioned in conjunction with FIG. 1. In FIG. 5(a), the test information set instruction is represented by thirty-two bits and comprises an operation code "88" consisting of zeroth through seventh bits B0 to B7, an optional code consisting of eighth through fifteenth bits B8 to B15, and an additional code consisting of sixteenth through thirty-first bits B16 to B31. In the example, update of the test information is indicated by the operation code "88". When the optional code represents "01", the set request SRE (FIG. 1) is supplied to the AND gate 25. In order to indicate the result of execution of the test information set instruction, a set condition code CC is utilized as described later. The set condition code CC represents whether or not the test information is set into the logic one value. For example, when the test information is set into the logic one value by the set request SRE, the set condition code CC is set into zero "0". If the test information does not set into the logic one value regardless of supplying of the set request SRE, the set condition code CC is set into two "2".

In FIG. 5(b), the reset instruction is similar to that illustrated in FIG. 5(a). If the optional code represents "00", the reset request RRE (FIG. 1) is supplied to the test information bit register 26. As a result, the test information is changed from the logic one value to the logic zero value. In this event, a reset condition code CC' is set into zero "0".

Figure 6:
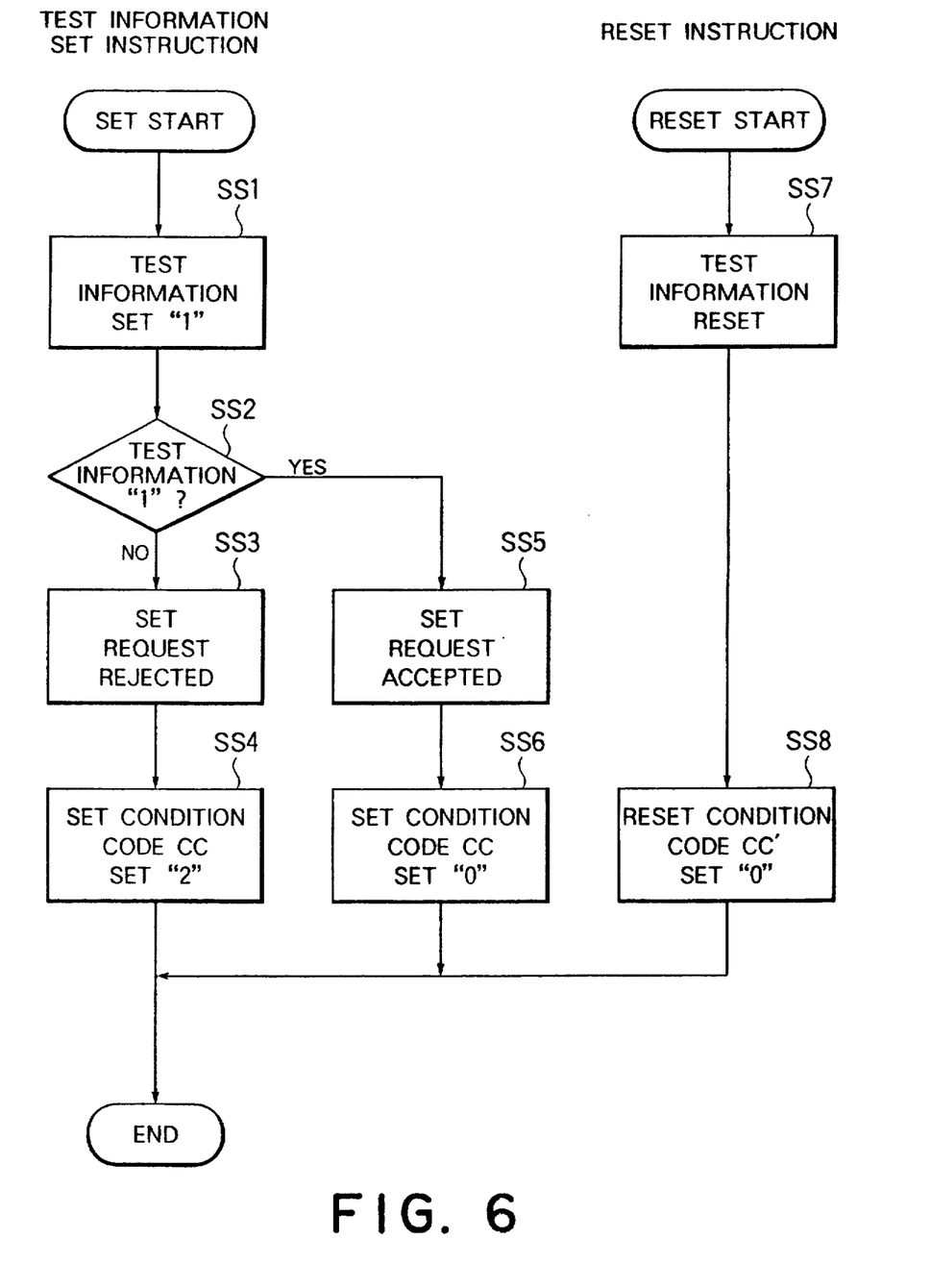
FIG. 6 is a flow chart for use in describing the test information set and the reset instructions carried out by the data processors illustrated in FIG. 1.

Referring to FIG. 6, the description will proceed to the test information set instruction and the reset instruction. It will be assumed that the first data processor 11 executes the test information set instruction and the reset instruction. At a first step SS1, the test request SRE is supplied from the first data processor 11 to the AND gate 25 in order to set the test information on the test information bit register 26 the logic one value. At a second step SS2, the first data processor 11 decides whether or not the test information bit register 26 has the logic one value. If the test information bit register 26 has the logic zero value, the operation proceeds to a third step SS3. At the third step SS3, the first data processor 11 decides that the set of the logic one value is rejected. Then, the third step SS3 is succeeded by a fourth step SS4. At the fourth step SS4, the set condition code CC is changed to "2". Thus, the operation of the test information set instruction is completed.

In the second step SS2, when the test information bit register 26 has the logic one value, the operation proceeds to a fifth step SS5. At the fifth step SS5, the first data processor 11 decides that the set of the logic one value is accepted. In this event, the set condition code CC is set into "0" at a sixth step SS6. Thus, the operation of the test information set instruction is completed.

In the operation of the reset instruction, the reset request RRE is supplied to the test information bit register 26 at a seventh step SS7. In this event, the reset condition code CC' is set into "0" at an eighth step SS8. Thus, the operation of the reset instruction is completed.

Figure 7:
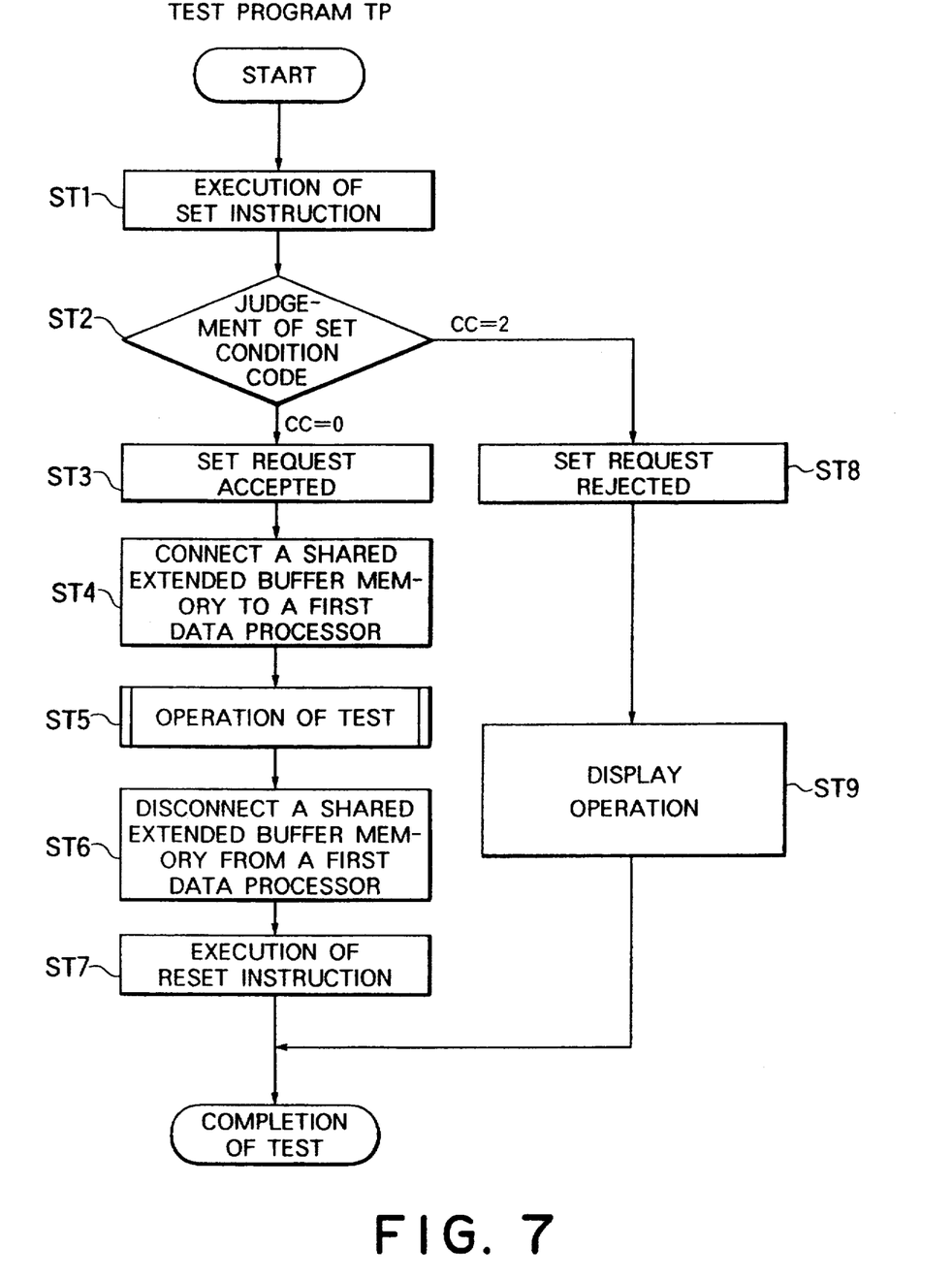
FIG. 7 is a flow chart for use in describing a test program carried out by the data processors illustrated in FIG. 1.

Referring to FIG. 7, the description will be made as regards the predetermined test program TP mentioned in conjunction with FIG. 3. Let the first data processor 11 require the test for the shared extended buffer memory 10. At a first step ST1, the first data processor 11 executes the test information set instruction. As described in conjunction with FIG. 6, the test information set instruction is for setting the test information on the test information bit register 26 (FIG. 1) the logic one value.

At a second step ST2, the first data processor 11 judges whether the set condition code CC represents "0" or whether the set condition code CC represents "2". If the condition code CC represents "0", the operation proceeds to a third step ST3. At the third step ST3, the first data processor 11 decides that the set request SRE is accepted. This means that the shared extended buffer memory 10 is vacant for the reason mentioned in conjunction with FIG. 1. Accordingly, the shared extended buffer memory 10 is logically connected to the first data processor 11 at a fourth step ST4. Then, the test for the shared extended buffer memory 10 is carried out by the first data processor 11 at a fifth step ST5. The first data processor 11 judges whether or not the shared extended buffer memory 10 has a trouble or an obstacle.

When the test is completed, the shared extended buffer memory 10 is logically disconnected from the first data processor 11 at a sixth step ST6. Subsequently, the reset instruction is executed at a seventh step ST7 as described in conjunction with FIG. 6.

In the second step ST2, if the set condition code CC represents "2", the operation proceeds to an eighth step ST8. At the eighth step ST8, the first data processor 11 decides that the set request SRE is rejected. For the reason mentioned in conjunction with FIG. 1, this means that one of the first through the fourth data processors 11 to 14 occupies the shared extended buffer memory 10. In this event, a display unit (not shown) displays that one of the first through the fourth data processors 11 to 14 occupies the shared extended buffer memory 10. Thus, the execution of the test is stopped.

As apparent from the description, it is possible to automatically carry out the test of the shared extended buffer memory without a judgement of an operator.

The above-mentioned operation is applied to the second through the fourth data processors.

While this invention has thus far been described in conjunction with a preferred embodiment thereof, it will readily be possible for those skilled in the art to put this invention into practice in various other manners.

What is claimed is:

1. An extended buffer memory shared among a plurality of processors and operable to carry out a data transfer operation to and from one of said plurality of processors which is logically connected to said extended buffer memory, each of said plurality of processors supplying a set request to said extended buffer memory when each of said plurality of processors carries out a test of said extended buffer memory in accordance with a predetermined test program, said extended buffer memory comprising:

a plurality of connection information indicating means each of which corresponds to each of said plurality of processors for indicating whether or not said each of said plurality of processors is logically connected to said extended buffer memory;

test information indicating means for indicating whether or not the one of said plurality of processors is capable of carrying out said test; and authorizing means connected to said plurality of connection information indicating means and supplied with said set request for authorizing said test request when all of said connection information indicating means indicate that all of said plurality of processors are not logically connected to said extended buffer memory, said test information indicating means thereby indicating that the one of said plurality of processors is capable of carrying out said test.

2. An extended buffer memory as claimed in claim 1, wherein said authorizing means is an AND gate having a plurality of input terminals connected to said plurality of connection information indicating means and having an additional input terminal supplied with said set request.

3. A method of testing an extended buffer memory shared among a plurality of processors and operable to carry out a data transfer operation to and from one of said plurality of processors which is logically connected to said extended buffer memory, each of said plurality of processors supplying a set request to said extended buffer memory when each of said plurality of processors carries out a test for said extended buffer memory in accordance with a predetermined test program, said extended buffer memory comprising test information indicating means for indicating, by test information, whether or not one of said plurality of processors is capable of carrying out said test, said test information representing that the one of said plurality of processors is capable of carrying out said test when said test information has a predetermined logic value, said predetermined test program comprising the steps of:

executing a set instruction to make said test information indicating means have said test information of said predetermined logic value;

deciding whether or not said test information indicating means have said test information of said predetermined logic value; and logically connecting the one of said plurality of processors to said extended buffer memory when said test information indicating means have said test information of said predetermined logic value, said test being authorized when said test information indicating means has said test information of said predetermined logic value, said test being rejected when said test information indicating means does not have said test information of said predetermined logic value.

* * * * *